(12) United States Patent
Ito et al.

(10) Patent No.: US 8,133,562 B2
(45) Date of Patent: Mar. 13, 2012

(54) PLASTIC FORMED ARTICLES HAVING A VAPOR DEPOSITED FILM AND METHOD OF PRODUCING THE SAME

(75) Inventors: Takurou Ito, Yokohama (JP); Hiroki Mori, Yokohama (JP); Hiroshi Nakao, Yokohama (JP); Kazuhiko Yamazaki, Yokohama (JP)

(73) Assignee: Toyo Seikan Kaisha, Ltd., Tokyo (JP)

( * ) Notice: Subject to any disclaimer, the term of this patent is extended or adjusted under 35 U.S.C. 154(b) by 348 days.

(21) Appl. No.: 12/594,683

(22) PCT Filed: Jul. 26, 2007

(86) PCT No.: PCT/JP2007/065104
§ 371 (c)(1),
(2), (4) Date: Oct. 5, 2009

(87) PCT Pub. No.: WO2008/129688
PCT Pub. Date: Oct. 30, 2008

(65) Prior Publication Data
US 2010/0112252 A1   May 6, 2010

(30) Foreign Application Priority Data

Apr. 6, 2007 (JP) ................................. 2007-100755

(51) Int. Cl.
*B29C 47/00* (2006.01)
(52) U.S. Cl. ............... 428/36.9; 428/36.91; 427/575
(58) Field of Classification Search ........... 428/36.91, 428/36.9, 35.7; 427/575
See application file for complete search history.

(56) References Cited

U.S. PATENT DOCUMENTS

| 5,191,779 | A | * | 3/1993 | Imazu et al. ................. 72/46 |
| 5,656,076 | A | | 8/1997 | Kikkawa |
| 5,747,633 | A | * | 5/1998 | Ito et al. ..................... 528/272 |
| 6,919,114 | B1 | | 7/2005 | Darras et al. |
| 7,052,752 | B2 | * | 5/2006 | Iwatsubo et al. ........... 428/36.6 |
| 7,442,780 | B2 | * | 10/2008 | He et al. ..................... 534/634 |
| 2005/0271846 | A1 | | 12/2005 | Suzuki |
| 2010/0112252 | A1 | * | 5/2010 | Ito et al. ..................... 428/35.7 |
| 2010/0200587 | A1 | * | 8/2010 | Ito et al. ..................... 220/62.19 |

FOREIGN PATENT DOCUMENTS

| JP | 07-321041 A | 12/1995 |
| JP | 2000-177046 A | 6/2000 |
| JP | 2002-274521 A | 9/2002 |

(Continued)

*Primary Examiner* — N. Edwards
(74) *Attorney, Agent, or Firm* — Sughrue Mion, PLLC (57) ABSTRACT

A plastic formed article comprising a plastic substrate and a vapor deposited film formed on the surface of the plastic substrate by a plasma CVD method, wherein the vapor deposited film includes an organometal vapor deposited layer having an element ratio C/Si of 2.5 to 13 and an element ratio O/M of not larger than 0.5, and a hydrocarbon vapor deposited layer; and the hydrocarbon vapor deposited layer has a thickness in a range of 40 to 180 nm, exhibits peaks stemming from CH, $CH_2$ and $CH_3$ over a region of wave numbers of 3200 to 2600 $cm^{-1}$ as measured by FT-IR, and has a $CH_2$ ratio of not larger than 35% and a $CH_3$ ratio of not less than 40%. A film is deposited on a plastic formed article without deteriorated by oxidation, without thermally deformed or without thermally deteriorated not only when PET or polyolefin is used but also when polylactic acid is used as the plastic substrate.

21 Claims, 2 Drawing Sheets

FOREIGN PATENT DOCUMENTS

| | | |
|---|---|---|
| JP | 2002-280383 A | 9/2002 |
| JP | 2004-018649 A | 1/2004 |
| JP | 2004-314407 A | 11/2004 |
| JP | 2005-058941 A | 3/2005 |
| JP | 2005-097678 A | 4/2005 |
| JP | 2005-256061 A | 9/2005 |
| JP | 2006-089073 A | 4/2006 |
| JP | 2006-131306 A | 5/2006 |
| JP | 2007-015139 A | 1/2007 |
| JP | 2007-261077 A | 10/2007 |

\* cited by examiner

RESULTS OF FT-IR ANALYSIS

PLASTIC FORMED ARTICLES HAVING A VAPOR DEPOSITED FILM AND METHOD OF PRODUCING THE SAME

TECHNICAL FIELD

The present invention relates to a plastic formed article having a vapor deposited film formed on the surface thereof by a plasma CVD method and to a method of producing the same.

BACKGROUND ART

In order to improve properties of various base materials, it has been attempted to form a vapor deposited film on their surfaces by a plasma CVD method. In the field of packing materials, it is a known practice to improve gas shut-off property by forming a vapor deposited film on the plastic base materials such as containers by the plasma CVD method. For example, there has been known a method of forming a vapor deposited film of a silicon oxide on the surfaces of the plastic containers such as PET bottles by the plasma CVD method by using a mixed gas of an organosilicon compound and oxygen as a reaction gas, in order to improve gas-barrier property.

The above silicon oxide film is basically highly rigid and brittle. When deposited on a plastic substrate, the silicon oxide film poorly follows the deformation of the plastic substrate, easily peels off and lacks closely adhering property. Therefore, it becomes necessary to deposit a film of the silicon oxide after a closely adhering layer is formed on the surface of the plastic substrate. For example, patent document 1 proposes forming a closely adhering layer rich in carbon element (C) on the surface of a plastic substrate by conducting the plasma CVD by using a reaction gas having a high organosilicon compound concentration or by employing a low-output condition prior to depositing a film of silicon oxide.

Study has also been conducted extensively concerning depositing the films other than depositing the silicon oxide. For example, a patent document 2 is proposing the formation of a hydrocarbon type vapor deposited film comprising amorphous carbon as a chief component by the plasma CVD on the surfaces of the plastic containers. Moreover, patent document 3 is proposing the formation of a vapor deposited film on the inner surface of a plastic container by the plasma CVD method, the vapor deposited film having a film structure in which a diamond-like carbon film (hydrocarbon vapor deposited film) is formed on the silicon oxide film.

Patent document 1: JP-A-2005-97678
Patent document 2: JP-A-2006-131306
Patent document 3: JP-A-2006-89073

DISCLOSURE OF THE INVENTION

In recent years, a lactic acid which is a representative example of a biodegradable plastic material is drawing attention in a variety of fields amid the environmental problems. In the field of packing materials, too, containers made from a polylactic acid have been put into practical use. However, the polylactic acid container has poor gas-barrier property and heat resistance which are inferior to those of the polyethylene terephthalate container, and attempts have been made to improve gas-barrier property and like properties by forming the vapor deposited film.

The silicon oxide vapor deposited film disclosed in the above patent document 1 exhibits excellent gas-barrier property when applied to a polyethylene terephthalate (PET) container. When applied to a container made of a lowly heat-resistant resin having a low glass transition point (e.g., polylactic acid container and polyolefin container), however, the silicon oxide vapor deposited film disclosed in the patent document 1 develops various problems. In particular, when the silicon oxide film is applied to a container made from the polylactic acid, the plastic substrate is thermally deformed by the oxygen plasma at the time of forming the vapor deposited film and the plastic substrate is oxidized and deteriorated generating offensive taste and offensive odor.

For example, the polylactic acid has a glass transition point (Tg) which is 58° C. and exhibits deteriorated thermal properties as compared to PET or the like (e.g., PET has a TG of 70° C.). That is, in order to obtain a barrier property, the vapor deposited film of silicon oxide must be formed under a high output condition (usually, a vapor deposition with a microwave output of not less than 600 W for not shorter than 4 seconds) by using an oxygen gas and an organometal gas. Upon conducting the vapor deposition under the above high-output condition, however, the base material of polylactic acid is thermally deformed or thermally deteriorated due to the heat of oxygen plasma or other plasma generated in the step of vapor deposition. When a film is formed on the polylactic acid container, in particular, a problem arouses such as generating offensive odor in the bottle. Further, the vapor deposited film of silicon oxide is hard, brittle, lacks flexibility and forms hydrophilic groups such as silanol groups. Namely, the vapor deposited film of silicon oxide poorly follows the deformation of the plastic base material, poorly adheres thereto and exhibits a low barrier property against water.

On the other hand, the hydrocarbon vapor deposited film such as a diamond-like carbon film (DLC film) has a problem of getting colored, but can be formed with a low output and in a short period of time as compared to the silicon oxide film and can, therefore, be formed on the surface of the polylactic acid base material without causing the plastic base material to be thermally deformed or thermally deteriorated. However, the hydrocarbon vapor deposited film is chiefly constituted by carbon (C) element and hydrogen (H) element, is inert, has poor chemical affinity to the plastic base material, and involves a problem concerning the closely adhering property. As means for improving the closely adhering property between the base material and the hydrocarbon vapor deposited film, there is generally employed a method of introducing impurity elements other than carbon (C) element and hydrogen (H) element into the hydrocarbon film. In this case, however, the water- and oxygen-barrier property decreases though the closely adhering property is improved relative to the plastic base material. In order to improve the closely adhering property to the base material yet improving the barrier property, therefore, it is desired that the hydrocarbon vapor deposited film chiefly comprises carbon (C) element and hydrogen (H) element containing little impurities other than carbon (C) element and hydrogen (H) element.

For example, the hydrocarbon vapor deposited film disclosed in the patent document 2 has a composition of $CH_3$, $CH_2$ and CH at a ratio of 25%, 60% and 15% on the basis of the total of these three components. This deposited film has a long-chain branched polymer-like hydrocarbon structure with a large $CH_2$ ratio, and features a high flexibility and excellently adhering property to the PET and the like lacking, however, closely adhering property to the polylactic acid which is more hydrophilic than PET. Therefore, the film peels off due to the water content and exhibits low barrier property against water and oxygen.

When the DLC (hydrocarbon type) vapor deposited film is formed on the silicon oxide vapor deposited film as taught in the patent document 3, the base material of polylactic acid is thermally deformed due to the oxygen plasma produced for forming the silicon oxide vapor deposited film or offensive taste and offensive odor generate due to the oxidation and deterioration. Besides, peeling of film due to water cannot be effectively avoided. Barrier property against water is not satisfactory, either.

It is, therefore, an object of the present invention to provide a plastic formed article having a vapor deposited film which can be formed without causing the plastic base material to be thermally deformed or thermally deteriorated at the time of forming the vapor deposited film not only when PET is used but also when a plastic base material having a glass transition point (Tg) lower than that of PET and having a low thermal deformation temperature (having low heat resistance) is used as the plastic base material and, particularly, even when a polylactic acid or a polyolefin is used, exhibiting high barrier property against oxygen and water, excellently adhering property to the plastic base material and effectively preventing the peeling of film caused by water.

According to the present invention, there is provided a plastic formed article comprising a plastic substrate and a vapor deposited film formed on a surface of the plastic substrate by a plasma CVD method, wherein:

the vapor deposited film includes an organometal vapor deposited layer formed on a side of the plastic substrate and having an element ratio C/M (M is a metal element) of 2.5 to 13 and an element ratio O/M of not larger than 0.5, and a hydrocarbon vapor deposited layer formed on the organometal vapor deposited layer; and the hydrocarbon vapor deposited layer has a thickness in a range of 40 to 180 nm, exhibits peaks stemming from CH, $CH_2$ and $CH_3$ over a region of wave numbers of 3200 to 2600 $cm^{-1}$ as measured by FT-IR, and has a $CH_2$ ratio of not larger than 35% and a $CH_3$ ratio of not less than 40% per the total of CH, $CH_2$ and $CH_3$ calculated from the above peaks.

Namely, in the present invention, the hydrocarbon vapor deposited layer is a short-chain branched hydrocarbon vapor deposited film having a large ratio of a $CH_3$ structural unit.

In the plastic formed article of the present invention, it is desired that:
(1) The element M is Si;
(2) The organometal vapor deposited layer has a thickness in a range of 3 to 40 nm;
(3) The plastic substrate is formed by using a biodegradable plastic material and, particularly, a polyhydroxyalkanoate such as polylactic acid; and
(4) The plastic substrate is a bottle, and the vapor deposited film is formed on at least an inner surface of the bottle.

According to the present invention, there is further provided a method of producing a plastic formed article having a vapor deposited film on the surface thereof, comprising the steps of:

forming an organometal vapor deposited layer having an element ratio C/M (C is a carbon element, M is a metal element) of 2.5 to 13 and an element ratio O/M of not larger than 0.5 by a plasma CVD without using oxygen but feeding an organometal compound gas as a reaction gas onto a plastic substrate; and forming a hydrocarbon vapor deposited layer on the organometal vapor deposited layer by a plasma CVD with using microwaves or a high frequency of an output of not less than 450 W while feeding an aliphatic unsaturated hydrocarbon gas or an aromatic hydrocarbon gas as a reaction gas.

In the present invention, the vapor deposited film formed on the plastic substrate has a hydrocarbon vapor deposited layer. Here, a feature resides in that the hydrocarbon vapor deposited layer is formed on the organometal vapor deposited layer that is formed on the surface of the plastic substrate. That is, the organometal vapor deposited layer formed on the plastic substrate has an element ratio O/M (O is an oxygen element, M is a metal element, hereinafter the same) of as small as 0.5 or less (particularly, the oxygen content is substantially zero), has an element ratio C/M of 2.5 to 13, has a large content of carbon element, and is rich in organic property.

The organometal vapor deposited layer can be formed by the plasma CVD of a small output without using oxygen gas but using a gas of an organometal compound (particularly preferably, an organometal compound without containing oxygen) having an element ratio O/M of not larger than 0.5. The above method makes it possible to effectively avoid the thermal deformation or the thermal deterioration caused by the oxygen plasma at the time of forming the film even by using a plastic substrate having a low heat resistance and, therefore, to effectively prevent the generation of offensive taste or offensive odor caused by the oxidation and deterioration of the plastic substrate. Besides, the vapor deposited layer is rich in organic property, exhibits excellent flexibility and favorably adhering property to the plastic substrate. By forming the hydrocarbon vapor deposited film on the organometal vapor deposited layer, therefore, it is made possible to provide a vapor deposited film exhibiting excellent barrier property.

The organometal vapor deposited layer has an element ratio O/M of as small as 0.5 or less and, particularly preferably, does not substantially contain oxygen element. At the time of forming the film, therefore, the silanol groups are contained at a low concentration making it possible to lower the hydrophilic property. Therefore, barrier property which is effective against water is exhibited. For example, in the case of an oxide type metal vapor deposited layer (SiOx: x=1.5 or larger) using an oxygen gas and an organometal compound gas, an SiOH structure is formed as a by-product at the time of forming the deposited film, the SiOH structure exhibiting a high hydrophilic property. Therefore, barrier property against water is lowered. The organometal vapor deposited layer, on the other hand, effectively improves even those chemical properties of the oxide-type metal vapor deposited layer.

By using an organometal such as organosilicon for the organometal vapor deposited layer, further, a bonding group of Si contributes to the bonding with the plastic substrate and with the hydrocarbon vapor deposited film, and no peeling occurs even when dipped in water. When a metal such as Si is not contained, the above effect is not exhibited, and the vapor deposited film peels off when dipped in water.

In the present invention, the organometal vapor deposited layer having the above properties works as a closely adhering layer and works to strongly join the hydrocarbon vapor deposited layer onto the plastic substrate when it is interposed between the plastic substrate and the hydrocarbon vapor deposited layer, and reinforces the barrier property of the hydrocarbon vapor deposited layer. Even when formed on, for example, the substrate of the polylactic acid, the organometal vapor deposited layer effectively prevents the peeling caused by water and exhibits excellent barrier property against oxygen and water.

Figure 2:
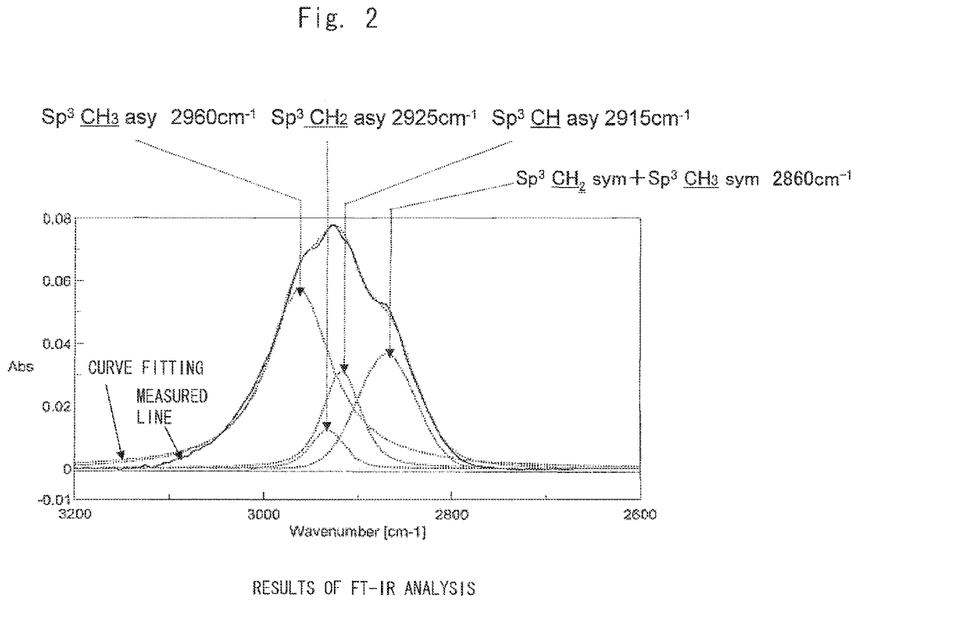
FIG. 2 is an FT-IR chart of a hydrocarbon vapor deposited layer in the plastic formed article of the present invention produced in Examples.

It is further important that the hydrocarbon vapor deposited layer formed on the organometal vapor deposited layer has a composition containing CH groups, $CH_2$ groups and $CH_3$ groups at a predetermined ratio. That is, the hydrocarbon vapor deposited layer exhibits peaks stemming from CH, $CH_2$ and $CH_3$ over a region of wave numbers of 3200 to 2600 $cm^{-1}$ as measured by FT-IR. For example, reference should be made to FIG. 2 showing an FT-IR chart of the hydrocarbon vapor deposited layer in the vapor deposited film on the polylactic acid substrate prepared in Examples appearing later. According to FIG. 2, a peak stemming from the $CH_3$ bond of an asymmetric oscillation mode appears at a wave number of 2960 $cm^{-1}$, a peak stemming from the $CH_2$ bond of the asymmetric oscillation mode appears at a wave number of 2925 $cm^{-1}$, and a peak stemming from the CH bond of the asymmetric oscillation mode appears at a wave number of 2915 $cm^{-1}$. According to the present invention, attention is given to the absorption peaks of the same asymmetric oscillation mode, and the hydrocarbon vapor deposited layer has such a composition that the $CH_2$ ratio is not larger than 35% and the $CH_3$ ratio is not smaller than 40% as calculated on the basis of the peak intensities (as for the detailed calculation method, see Examples). With the vapor deposited layer having the above composition being formed on the organometal vapor deposited layer, barrier property against oxygen and water is conspicuously improved as compared to the conventional DLC films, and the peeling due to water is effectively prevented.

Though it has not been clarified yet why the formation of the hydrocarbon vapor deposited layer of the above composition works to improve the barrier property against water and to prevent the peeling due to water, the present inventors presume the reasons as described below.

That is, the $CH_2$ ratio and the $CH_3$ ratio that lie within the above ranges mean that the hydrocarbon vapor deposited layer has a suitable degree of flexibility, is constituted by molecules having much branched structure and, further, having a dense structure. As a result, it is considered that the barrier property against water and oxygen is improved, improved adhering property is exhibited to the organometal vapor deposited layer, and peeling of film due to water is effectively prevented even when the vapor deposited film is formed on, for example, the polylactic acid substrate. For example, if the hydrocarbon vapor deposited film proposed by the patent document 2 is formed on the organometal vapor deposited film, the $CH_2$ ratio is great as compared to that of the present invention, and the film composition is not dense but is loose. Therefore, though the closely adhering property may be satisfactory, it is not allowed to obtain satisfactory barrier property against water and oxygen. Besides, the barrier property against water is low. Therefore, if the hydrocarbon vapor deposited film is applied to the polylactic acid substrate, water infiltrates into the interface to the organometal vapor deposited layer, and the vapor deposited film tends to be easily peeled off. Further, the hydrocarbon vapor deposited layer of a composition having a low $CH_3$ ratio, e.g., having a zero $CH_3$ ratio, is devoid of flexibility and is very hard without being capable of following the deformation of the base material or of the organometal vapor deposited layer. Therefore, the film peels off and a predetermined barrier property is not obtained.

In the present invention, further, it is desired that the hydrocarbon vapor deposited layer has a thickness in a range of 40 to 180 nm. That is, the hydrocarbon vapor deposited layer having the above composition is formed by the plasma CVD of a large output and in a short period of time. As a result, the hydrocarbon vapor deposited layer has a thickness described above, and exhibits excellent barrier property against oxygen and water. That is, if the thickness is smaller than the above range, barrier property is not obtained to a sufficient degree despite the CH, $CH_2$ and $CH_3$ ratios lie in the above range; i.e., barrier property may be lost. If the thickness is greater than the above range, on the other hand, the film becomes hard, flexibility is impaired, closely adhering property to the lower organometal vapor deposited layer is spoiled, and predetermined barrier property is not obtained, either.

The plastic formed article of the present invention having the vapor deposited film with the above layer structure exhibits its excellent barrier property against oxygen and water, i.e., exhibits high barrier property even when the polylactic acid is used as the plastic substrate, effectively preventing the peeling of film due to water, and can be desirably used, particularly, in the field of packing materials such as containers.

BEST MODE FOR CARRYING OUT THE INVENTION

Figure 1:
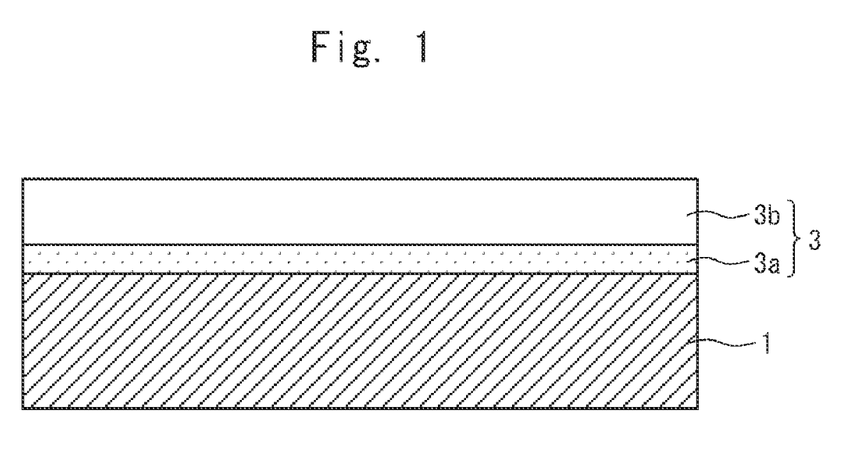
FIG. 1 is a view showing, in cross section, the structure of a plastic formed article of the present invention.

FIG. 1 shows the layer structure of a plastic formed article of the present invention. In FIG. 1, the plastic formed article comprises a plastic substrate 1 and a vapor deposited film 3 formed on the surface thereof. The vapor deposited film 3 includes an organometal vapor deposited layer 3a formed on the side of the surface of the plastic substrate 1, and a hydrocarbon layer 3b formed thereon. In the example of FIG. 1, the vapor deposited film 3 is formed on only one surface of the plastic substrate 1. However, the vapor deposited film 3 may be formed on both surfaces of the plastic substrate 1.

<Plastic Substrate 1>

In the present invention, the plastic substrate 1 for forming the vapor deposited film 3 is made from known thermoplastic resins, e.g., polyolefins such as low-density polyethylene, high-density polyethylene, polypropylene, poly 1-butene, poly 4-methyl-1-pentene or random or block copolymers of α-olefins like ethylene, propylene, 1-butene and 4-methyl-1-pentene; cyclic olefin copolymers; vinyl resins such as ethylene/vinyl acetate copolymer, ethylene/vinyl alcohol copolymer, ethylene/vinyl chloride copolymer, polyvinyl chloride, polyvinylidene chloride, vinyl chloride/vinylidene chloride copolymer, methyl polyacrylate and methyl polymethacrylate; styrene resins such as polystyrene, acrylonitrile/styrene copolymer, ABS and α-methylstyrene/styrene copolymer; polyamides such as nylon 6, nylon 6-6, nylon 6-10, nylon 11 and nylon 12; thermoplastic polyesters such as polyethylene terephthalate, polybutylene terephthalate and polyethylene naphthalate; polycarbonates; polyphenylene oxide; polybutylene succinate; poly(hydroxybutylate) and copolymers thereof; biodegradable plastics such as polyhydroxyalkanoate like polylactic acid; and blends thereof.

The invention exhibits the effect most conspicuously when there is used the plastic substrate 1 made from a biodegradable plastic material as represented by a polyhydroxyalkanoate of which a typical example is a polylactic acid or a polyolefin and, particularly, the biodegradable plastic material. That is, as described earlier, the biodegradable plastics have a lower glass transition point (Tg)(usually not higher than 60° C.) and a heat resistance lower than those of PET. Due to the heat of plasma at the time of depositing the film, therefore, the substrate tends to be thermally deformed, oxidized and deteriorated generating offensive taste and offensive odor. However, the vapor deposited film of the present invention exhibits satisfactory barrier property effectively avoiding the thermal deformation, oxidation and deterioration of the substrate at the time of depositing the film.

As the biodegradable plastics, further, the polyhydroxyalkanoate is used from the standpoint of general applicability in the field of packing materials and, particularly, the polylactic acid is most desired. The polylactic acid may be either a poly-L-lactic acid or a poly-D-lactic acid, or may be a molten blend of the poly-L-lactic acid and the poly-D-lactic acid, or may be a copolymer thereof. Further, there may be used a copolymer with a glycolic acid which is a polyoxy acid exhibiting biodegrading property or with a caprolactone. Further, the polylactic acid may be blended with glycolic acid, cellulose acetate or polycaprolactone.

The plastic substrate 1 may assume the form of a film or a sheet, may be a container such as a bottle, a cup, a tube or the like, or may be any other formed article without any particular limitation, and may be formed in a suitable shape depending upon the use. However, since the vapor deposited film 3 which will be described later exhibits excellent gas-barrier property and water-barrier property, it is desired that the plastic substrate 1 is in the form of a bottle and that the vapor deposited film 3 that will be described later is formed on the inner surface of the bottle. There is no limit, either, on means for forming the plastic substrate 1, and there may be employed biaxial draw-blow forming, direct extrusion blow forming, etc.

Further, the plastic substrate 1 may assume a multilayer gas-barrier structure having the above-mentioned thermoplastic resin (preferably, olefin resin) as inner and outer layers, and an oxygen-absorbing layer between the inner layer and the outer layer.

<Vapor Deposited Film 3>

In the present invention, the vapor deposited film 3 formed on the plastic substrate 1 includes an organometal vapor deposited layer 3a and a hydrocarbon vapor deposited layer 3b. The layers 3a and 3b are deposited by a plasma CVD by using a reaction gas containing a predetermined compound gas, for example, by a plasma CVD based on a glow discharge by utilizing, for example, microwaves or high frequencies. When high frequencies are used, however, the plastic substrate 1 on which the film is to be formed must be held by a pair of electrode substrates. When the vapor deposited film 3 is to be formed on the plastic substrate 1 of the shape of a solid container such as bottle, therefore, it is desired to execute the plasma CVD by using microwaves (i.e., a device of a complex structure is required for holding the container wall by a pair of electrode substrates).

To execute the plasma CVD, the plastic substrate 1 on which the film is to be deposited is disposed in a chamber maintained at a predetermined degree of vacuum, a predetermined reaction gas is fed onto the surface of the substrate 1 on the side on where the film is to be deposited, and microwaves of a predetermined output are fed to deposit the film. When high frequencies are used, the plastic substrate 1 is held between the pair of electrodes, the reaction gas is fed in the same manner as described above, and high frequencies are applied maintaining a predetermined output to deposit the film.

-Organometal Vapor Deposited Layer 3a-

In the vapor deposited film 3 of the present invention formed on the surface of the plastic substrate 1, the organometal vapor deposited layer 3a works as a closely adhering layer, and is formed for forming the hydrocarbon vapor deposited layer 3b on the plastic substrate 1 maintaining a highly adhering property. Upon forming the organometal vapor deposited layer 3a, it is allowed to form the hydrocarbon vapor deposited layer 3b even on the polylactic acid substrate maintaining a highly adhering property and, besides, to effectively prevent the hydrocarbon vapor deposited layer 3b from being peeled off by water.

The organometal vapor deposited layer 3a is formed by executing the plasma CVD without using oxidizing gas but using, as a reaction gas, a gas of an organometal compound having an element ratio O/M of not higher than 0.5 and, particularly preferably, a gas of an organometal compound without containing oxygen atoms. Therefore, the organometal vapor deposited layer 3a is constituted by a layer having an element ratio O/M of not larger than 0.5, i.e., containing little oxygen elements and, particularly, is constituted by a layer of a non-oxide type. That is, the layer 3a is formed in a state where the oxygen elements are contained in small amounts or where no oxygen is present. Therefore, the step of depositing the film reliably suppresses the thermal decomposition or the oxidation of the plastic substrate 1 caused by the oxygen plasma, and makes it possible to deposit the film with a low output in a short period of time. When applied to the plastic substrate 1 made from, for example, a resin having a low glass transition point such as polylactic acid, the organometal vapor deposited film effectively prevents the thermal deformation or the thermal deterioration, and prevents the generation of offensive odor or peeling of the vapor deposited film caused by the thermal hysteresis.

The organometal vapor deposited film 3a formed without using oxidizing gas but using, as the reaction gas, a gas of an organometal compound containing oxygen atoms in an amount of not more than 0.5 in terms of the O/M ratio or a gas of an organometal compound without containing oxygen atoms, has an O/M ratio (O is an oxygen element, M is a metal element) of as low as 0.5 or less, or does not substantially contain oxygen elements, but contains a metal (M) stemming from the organometal compound and carbon atoms (C) stemming from the hydrocarbon structure of the organometal compound and, further, contains H, the atomic ratio (C/M) lying in a range of 2.5 to 13. That is, the organometal vapor deposited layer 3a contains much carbon component and, therefore, exhibits high flexibility and excellently adhering property to the plastic substrate 1 and to the hydrocarbon vapor deposited layer 3b. That is, if the C/M ratio is smaller than the above range, the closely adhering property to the hydrocarbon vapor deposited layer 3b formed thereon is impaired. If the carbon amount is too large and the ratio of the metal element (M) decreases, the closely adhering property to the plastic substrate 1 decreases.

Further, the organometal vapor deposited layer 3a contains oxygen in small amounts and, particularly preferably, does not substantially contain oxygen element. Therefore, formation of the polar group structure as represented by silanol groups can be decreased, and the vapor deposited film exhibits suppressed hydrophilic property.

It is desired that the organometal vapor deposited layer 3a has a thickness of 3 to 40 nm and, particularly, in a range of 5 to 30 nm. That is, when the thickness is smaller than the above range, the adhering property to the hydrocarbon vapor deposited layer 3b that will be described below becomes insufficient. Formation of the organometal vapor deposited layer 3a maintaining a large thickness is disadvantageous in cost. Besides, an extended period of time is required for forming the organometal vapor deposited layer 3a. Accordingly, the microwave output (quantity of heat) increases at the time of forming the film, and the plastic substrate undergoes the thermal deformation or thermal deterioration.

The organometal vapor deposited layer 3a is formed by the plasma reaction of a low output by using a gas of an organometal compound as the reaction gas but without using oxygen gas, i.e., in the absence of oxygen. If, for example, the oxygen gas is used together with the gas of the organometal compound, the plastic substrate 1 is thermally deformed and is thermally deteriorated due to the oxidation and deterioration caused by the oxygen plasma. Besides, hydrophilic property increases accompanying the formation of the polar groups such as silanol groups, and barrier property against water decreases.

Therefore, the organometal compound contains no oxygen in the molecules thereof or is the one in which the O/M ratio in the molecular chains is not larger than 0.5 even if oxygen element is contained in the molecules; i.e., the organometal compound is, particularly, the one which can be easily gasified. For example, there can be exemplified organoaluminum compounds such as trialkylaluminum, organotitanium compounds such as tetraalkyltitanium, and various organosilicon compounds. From the standpoint of cost and depositing the film, however, the organosilicon compounds are particularly desired.

Though not limited thereto only, examples of the organosilicon compound without containing oxygen atom include silane compounds such as hexamethyldisilane, methylsilane, dimethylsilane, trimethylsilane, diethylsilane, propylsilane, vinyltrimethylsilane, vinyltriethoxysilane, vinyltrimethoxysilane, phenyltrimethoxysilane, phenylsilane and t-butylmethylsilane. Further, examples of the organometal compound having an O/M element ratio of not larger than 0.5 in the molecular chains include silane compounds such as hexamethyldisiloxane, methoxytrimethylsilane, dimethylethoxysilane, methoxydimethylvinylsilane, ethoxytrimethylsilane, propynyloxytrimethylsilane, dimethylethoxyethynylsilane, allyloxymethylsilane, ethoxydimethylvinylsilane, isopropyoxytrimethylsilane, trimethylpropyoxysilane, trimethylisopropyoxysilane, triethylsilanol, t-butyltrimethylsilane, methylpropyoxytrimethylsilane, isobutoxytrimethylsilane and butoxytrimethylsilane. The organosilicon compounds can be used in a single kind or in a combination of two or more kinds.

In the present invention, from the standpoint of forming the organometal vapor deposited layer 3a having excellently adhering property to the plastic substrate 1 and, particularly, to the polylactic acid substrate, it is desired to use a silane compound having an aliphatic unsaturated group represented by, for example, the following formula (1), $$(R^1)_n\text{—}Si(R^2)_{4-n} \tag{1}$$

wherein $R^1$ is a group having an aliphatic unsaturated group, such as vinyl group or allyl group, $R^2$ is an aliphatic or aromatic hydrocarbon group, such as alkyl group, aryl group or aralkyl group, and n is an integer of 1 to 4, among the above-mentioned organosilicon compounds. As the silane compounds, there can be exemplified vinyltrimethylsilane, phenylsilane, vinyltriethoxysilane, vinyltrimethoxysilane and phenyltrimethoxysilane. Among them, the most preferred example is a trimethylvinylsilane from such a standpoint that it can be easily gasified.

As the reaction gas, the gas of the organometal compound such as the above organosilicon compound can be used alone or can be used being mixed with a gas of an unsaturated aliphatic hydrocarbon or of an aromatic hydrocarbon (hereinafter often simply called hydrocarbon gas). Namely, the hydrocarbon gas is also used for forming the hydrocarbon vapor deposited layer 3b that will be descried later. By using the hydrocarbon gas in combination, it is made possible to form an organometal vapor deposited layer 3a rich in carbon and having high flexibility, to enhance adhering property to the plastic substrate 1 and, at the same time, to enhance adhering property to the hydrocarbon vapor deposited layer 3b. Further, from the standpoint of forming the hydrocarbon vapor deposited layer 3b that will be described later following the formation of the organometal vapor deposited layer 3a, too, it is advantageous to use the hydrocarbon gas in combination. Further, it is most effective if the hydrocarbon gas is used in combination with the organosilicon compound containing the unsaturated bond represented by the above formula (1). That is, the hydrocarbon gas becomes compatible on a molecular level with the organosilicon compound represented by the formula (1), and forms the organometal vapor deposited film of a stable and homogeneous composition without causing the film properties to be dispersed.

The organometal vapor deposited layer 3a has a structure comprising carbon, metal, hydrogen or oxygen, but may contain other elements such as nitrogen and the like.

In the present invention, examples of the unsaturated aliphatic hydrocarbon include alkenes such as ethylene, propylene, butene and pentene; alkynes such as acetylene and methylacetylene; alkadienes such as butadiene and pentadiene; and cycloalkenes such as cyclopentene and cyclohexene while examples of the aromatic hydrocarbon include benzene, toluene, xylene, indene, naphthalene and phenanthrene. In the present invention, the unsaturated aliphatic hydrocarbon is suited from the standpoint of film properties and, particularly, ethylene and acetylene are most desired.

In the mixed gas (reaction gas) of the above organometal compound and the hydrocarbon, the concentration of the organometal compound gas is so set that the element ratio (C/M) in the formed film lies in the above-mentioned range, and is desired to be not smaller than 50 mol % and, particularly, not smaller than 60 mol % from the standpoint of compatibility of the two gases. If the concentration of the organometal compound lies outside the above range, balance in the compatibility presumably decreases between the two compounds. Therefore, the film properties become unstable, the film becomes liable to peel between the plastic material and the vapor deposited film resulting in a decrease in the film properties such as barrier property against oxygen and barrier property against water and, often, causing the film surfaces to be roughened due to the occurrence of cracks.

It is further allowable to adjust the concentration of the reaction gas by using various carrier gases as diluent together with the reaction gas. As the carrier gas, there can be exemplified inert gases such as argon gas and helium gas.

The present invention uses the reaction gas which does not contain oxygen gas, and uses the organometal compound having an O/M ratio of not larger than 0.5 or which does not contain oxygen element in the molecules. Therefore, the organometal vapor deposited layer 3a that is formed contains very little oxygen, e.g., has an O/M ratio of not larger than 0.5 or does not substantially contain oxygen element (O). The air may often be contained as contaminant in small amounts in the reaction gas. In such a case, too, properties of the organometal vapor deposited layer 3a after formed are not impaired if the O/M element ratio is not larger than 0.5, and the layer 3a works as a closely adhering layer. That is, when the amount of oxygen element is smaller than the amount of metal element and the film is formed with a low output, bonding of the M element and the oxygen element is formed at a low ratio suppressing the formation of silanol groups which are hydrophilic groups that form conspicuously when the SiOx (x=1.5 or more) is formed. When the ratio of oxygen element, i.e., the O/M ratio is not larger than 0.5 in the molecules of the organometal compound gas, the film that is formed exhibits film properties (closely adhering property, barrier property) to a satisfactory degree, and the content of the oxygen element can be neglected.

In the present invention, it is desired that the deposited film is formed by the plasma CVD by using the above-mentioned reaction gas, i.e., the film is formed by the glow discharge by utilizing microwaves or high frequencies of a low output. If the deposited film is formed with a large output on the plastic substrate 1 such as of, particularly, polylactic acid having a low glass transition point, the plastic substrate is often thermally deformed or thermally deteriorated due to the heat of plasma. Therefore, when the plasma CVD is executed by using microwaves, it is desired that the output thereof is in a range of 200 to 500 W. When the plasma CVD is executed by using high frequencies, it is desired that the output thereof is in a range of 200 to 600 W.

The flow rate of the reaction gas and the film-forming time (vapor deposition time) are so selected that the thickness of the organometal vapor deposited layer 3a lies in the above-mentioned range (3 to 40 nm and, particularly, 5 to 30 nm). In general, however, it is desired to set the film-forming time to lie in a range of 0.1 to 4 seconds and to form the organometal vapor deposited layer 3a having the above thickness in the above film-forming time. If the film-forming time is too long, the heat of plasma accumulates causing the plastic substrate 1 having a low glass transition point, such as of polylactic acid, to be thermally deformed or thermally deteriorated.

—Hydrocarbon Vapor Deposited Layer 3b—

In the present invention, a hydrocarbon vapor deposited layer 3b is formed on the organometal vapor deposited layer 3a exhibiting excellent barrier property against oxygen and excellent barrier property against water. Besides, the layer 3b exhibits excellently adhering property to the organometal vapor deposited layer 3a. Owing to high barrier property against water, further, the film is effectively prevented from being peeled by water. Even when the vapor deposited film 3 is formed on a plastic substrate such as of polylactic acid having low barrier property against water, the film is effectively prevented from being peeled by water and excellent barrier property is maintained over extended periods of time.

The hydrocarbon vapor deposited layer 3b is formed by the plasma CVD method by using a gas of a hydrocarbon compound as the reaction gas, and contains carbon element (C) as a chief component. As described earlier, however, the hydrocarbon vapor deposited layer 3b contains the CH structure, $CH_2$ structure and $CH_3$ structure, and has a composition different from that of a hard diamond-like carbon film (DLC film) which does not almost contain the $CH_3$ structure. The presence of these structures can be confirmed from peaks due to CH, $CH_2$ and $CH_3$ in a region of 3200 to 2600 $cm^{-1}$ as measured by FT-IR.

Further, the ratio of presence of the above bonding structures can be calculated based on the spectra found by FT-IR, and can be found by multiplying their peak intensities by the absorbency indexes specific to the absorption peaks. Concretely, the $CH_2$ ratio must not be larger than 35% and the $CH_3$ ratio must not be smaller than 40% relative to the total amount of the structural components from the standpoint of barrier property. Owing to the above composition, the hydrocarbon vapor deposited layer 3b exhibits a suitable degree of flexibility, excellently adhering property to the organometal vapor deposited layer 3a, possesses a dense film structure, and exhibits excellent barrier property against oxygen and the like. As a result, even when the vapor deposited film 3 is formed on the surface of the polylactic acid substrate, it is made possible to effectively avoid the peeling of film caused by the infiltration of water. To obtain excellent barrier properties against oxygen and water according to the present invention, in particular, it is desired that the $CH_2$ ratio is not larger than 35% and the $CH_3$ ratio is not smaller than 40%, preferably, the $CH_2$ ratio is not larger than 30% and the $CH_3$ ratio is not smaller than 45% and, particularly preferably, the $CH_2$ ratio is not larger than 20% and the $CH_3$ ratio is not smaller than 55%. As for the relative ratios of CH, $CH_2$ and $CH_3$, it is desired that the CH ratio is in a range of 10 to 40%, the $CH_2$ ratio is in a range of 0 to 35% and the $CH_3$ ratio is in a range of 40 to 90%. More preferably, the CH ratio is in a range of 10 to 40%, the $CH_2$ ratio is in a range of 0 to 30% and the $CH_3$ ratio is in a range of 45 to 90%. Most desirably, the CH ratio is in a range of 10 to 40%, the $CH_2$ ratio is in a range of 0 to 20% and the $CH_3$ ratio is in a range of 55 to 90%.

The hydrocarbon vapor deposited layer has constituent ratios of the CH, $CH_2$ and $CH_3$ structures comprising carbon and hydrogen lying in the above ranges, but may further contain a metal of the organometal vapor deposited layer, such as silicon, as well as oxygen, nitrogen, etc. in addition to carbon and hydrogen which are the constituent elements.

The hydrocarbon vapor deposited layer 3b has a thickness in a range of 40 to 180 nm and, preferably, 60 to 160 nm. When the thickness is smaller than the above range, it becomes difficult to maintain a predetermined barrier property. When the thickness exceeds the above range, on the other hand, the vapor deposited film possesses increased rigidity and becomes difficult to follow the deformation of bottle, causes film cracking or film peeling when the bottle is deformed such as when being filled with the content or when being gripped, eventually deteriorating the barrier property.

As the hydrocarbon compound used for forming the hydrocarbon vapor deposited layer 3b in the present invention, various hydrocarbons can be used without any particular limitation provided they can be easily gasified. Usually, however, unsaturated aliphatic hydrocarbons or aromatic hydrocarbons are preferred from the standpoint of forming a layer having excellently adhering property to the organometal vapor deposited layer 3a. The unsaturated aliphatic hydrocarbons and the aromatic hydrocarbons are the same as those used together with the gas of the organometal compound at the time of forming the organometal vapor deposited layer 3a described above. Concretely, examples of the unsaturated aliphatic hydrocarbon include alkenes such as ethylene, propylene, butene and pentene; alkynes such as acetylene and methylacetylene; alkadienes such as butadiene and pentadiene; and cycloalkenes such as cyclopentene and cyclohexene while examples of the aromatic hydrocarbon include benzene, toluene, xylene, indene, naphthalene and phenanthrene. Unsaturated aliphatic hydrocarbons are preferred and, particularly, ethylene and acetylene are most preferred.

The concentration of the reaction gas can be adjusted by using various carrier gases as diluent together with the gas (reaction gas) of the unsaturated hydrocarbon or aromatic hydrocarbon in quite the same manner as the case of forming the organometal vapor deposited layer 3a described above.

In the present invention, the plasma CVD using the gas of the hydrocarbon compound as the reaction gas is established by a glow discharge by utilizing microwaves or high frequencies to thereby form the hydrocarbon vapor deposited layer 3b. To obtain the above-mentioned composition of the hydrocarbon structure, however, the plasma CVD must be executed by a glow discharge using microwaves or high frequencies of a high output. Concretely, the output of microwaves and high frequencies should not be smaller than 450 W. In particular, it is desired that the output is 450 to 850 W when microwaves are used. When high frequencies are used, it is desired that the output thereof is 450 to 950 W. If the output is small, the $CH_2$ ratio becomes larger than the above-mentioned ratio and, therefore, a dense layer is not formed, and the barrier property is not satisfactory against oxygen and water. If the output is too large, further, the hydrocarbon vapor deposited layer 3b becomes very hard and spoils closely adhering property to the organometal vapor deposited layer 3a exhibiting unsatisfactory barrier property to oxygen and water. It is therefore desired that the output of microwaves or high frequencies is within the above range.

Further, since the plasma reaction is carried out by a glow discharge using microwaves or high frequencies of a large output as described above, the film-forming time is desirably set to be in a range of 0.5 to 5 seconds. When the microwaves are used, in particular, it is desired that the film-forming time is in a range of 1 to 4 seconds. When the high frequencies are used, the film-forming time is, particularly desirably, in a range of 1 to 4 seconds. If the film-forming time is too long, the hydrocarbon vapor deposited layer 3b becomes hard and spoils closely adhering property to the organometal vapor deposited layer 3a exhibiting unsatisfactory barrier property to oxygen and water.

In the present invention, the plasma CVD is executed by using microwaves or high frequencies of an output in the above-mentioned range and the film-forming time is selected as described above to thereby form a hydrocarbon vapor-deposited layer 3b in which the ratios of hydrocarbon structures of CH, $CH_2$ and $CH_3$ are in the above-mentioned ranges and the thickness is in the above-mentioned range.

In forming the hydrocarbon vapor deposited layer 3b as described above, an increase in the flow rate of the reaction gas is accompanied by an increase in the $CH_2$ ratio. In executing the plasma CVD by using microwaves or high frequencies, therefore, the flow rate of the reaction gas (hydrocarbon gas) is adjusted to be in a range of 10 to 100 sccm, and the reaction is carried out with the above output and in the above film-forming time to so adjust the composition that the ratios of hydrocarbon structures of CH, $CH_2$ and $CH_3$ lie in the above-mentioned ranges.

The above hydrocarbon vapor deposited layer 3b is formed under the high-output condition but the film-forming time is short. Therefore, even when a polylactic acid substrate is used, there occurs no thermal deformation or thermal deterioration in forming the film.

In forming the vapor deposited layer 3 according to the present invention, the step of depositing the hydrocarbon vapor deposited layer 3b on the organometal vapor deposited layer 3a may be a two-stage step of once evacuating the gas in the chamber after the organometal vapor deposited layer 3a has been deposited and, thereafter, introducing a hydrocarbon reaction gas to form the hydrocarbon plasma CVD deposited layer, or may be a one-stage step of introducing the organometal reaction gas and the hydrocarbon reaction gas in predetermined amounts and shutting off the gas for depositing the organometal layer after the organometal layer 3a has been deposited while continuously feeding the microwaves, or may be a one-stage step of using a mixed gas of the organometal reaction gas and the hydrocarbon reaction gas while changing the gas composition continuously or stepwise from a gas composition in which the amount of the organometal reaction gas is large toward a gas composition in which the hydrocarbon reaction gas is large while continuously feeding the microwaves.

In the present invention, the vapor deposited film 3 comprising the organometal vapor deposited layer 3a and the hydrocarbon vapor deposited layer 3b is formed on the plastic substrate 1 as described above to improve barrier property against oxygen and barrier property against water. Besides, the film is effectively prevented from being peeled off by water, and the plastic substrate 1 is effectively prevented from oxidized and deteriorated or from thermally deformed. Even when the vapor deposited film 3 is formed on the surface of a polylactic acid substrate having a low glass transition point, the substrate is effectively prevented from being thermally deformed or thermally deteriorated.

In the plastic formed article of the invention provided with the above vapor deposited film 3, further, a film is, as required, deposited on the hydrocarbon vapor deposited layer 3b by the plasma CVD to form a known vapor deposited layer such as a silicon oxide film or a diamond-like carbon film to improve properties such as gas-barrier properties.

EXAMPLES

Next, the invention will be described by way of Examples.

Examples 1 to 16

Comparative Examples 1 to 10

[Bottles for Testing Vapor Deposition]
The following bottles A to C were prepared as containers for testing vapor deposition.
Bottle A:
A polylactic acid bottle of a volume of 400 ml obtained by biaxially draw-blow forming a preform of a polylactic acid (PLA) resin.
Bottle B:
A polyethylene terephthalate resin bottle of a volume of 400 ml obtained by biaxially draw-blow forming a preform of a polyethylene terephthalate (PET) resin.
Bottle C:
A polyethylene bottle of a volume of 400 ml obtained by directly blow-forming a polyethylene (HDPE) resin.
[Vapor Deposition]
The vapor was deposited by the plasma CVD in a manner as described below.

The above bottles for testing on which the film is to be deposited were set in a chamber maintained at a predetermined degree of vacuum, a gas of an organometal compound was introduced as a reaction gas into the bottles for testing, and microwaves of 2.45 GHz were output to form an organometal vapor deposited layer. Next, acetylene was introduced as a reaction gas into the plastic containers at a flow rate of 30 sccm, and microwaves of 2.45 GHz were output to form a hydrocarbon film on the organometal vapor deposited film.

After the film was formed, the bottles were released to the open atmosphere to thereby obtain vapor deposited bottles on which the vapor deposited film was formed by using plasma CVD vapor depositing apparatus.

Tables 1 to 4 show the conditions for forming the organometal vapor deposited layer and the hydrocarbon layer employed in Examples and in Comparative Examples.
[Evaluation of the Vapor Deposited Bottles]
1. Water-barrier Property:

The vapor deposited bottles were filled with 400 ml of ion-exchanged water at room temperature, were sealed with rubber plugs, and were measured for their weights. Next, the bottles were preserved in an environment of 37° C., 25% RH for 7 days, measured again for their weights, and were calculated in terms of surface areas of the bottles to find the amounts of water that has permeated through per day ($g/m^2 \cdot day$). When the amount of water that has permeated through was not more than 7 $g/m^2 \cdot day$, it was so regarded that the bottle possessed water-barrier property. When the amount of water that has permeated through was not less than 7 $g/m^2 \cdot day$, it was so regarded that the bottle possessed poor water-barrier property.

2. Oxygen-barrier Property:

The vapor deposited bottles were put into a deaerating glow box, purged with a nitrogen gas, sealed with rubber plugs, and were preserved in an environment of 30° C., 25% RH for 7 days. Next, 1 ml of the gas in the container was collected by using a gas-tight syringe. The oxygen concentration was measured a gas chromatography for measuring the oxygen concentration, was calculated in terms of surface areas of the bottles to find the amounts of oxygen that has permeated through per day ($cc/m^2 \cdot day$).

3. Testing the Peeling of Films.

The vapor deposited bottles were filled with 400 ml of ion-exchanged water at room temperature, were preserved in a constant-temperature vessel maintained at 40° C. for 30 days, and were, thereafter, shaken 100 times. The bottles were observed by eyes from the outer side thereof. When transparent flakes floated in the bottle emitting scintillation, it was so judged that the vapor deposited film has peeled. When no transparent flake that emit scintillation was floating as observed by eyes, it was so judged that the film has not been peeled.

4. Odor of Water:

The vapor deposited bottles were filled with 400 ml of ion-exchanged water, and were preserved at 22° C. for 2 weeks. Thereafter, water was taken out and was subjected to a functional testing for detecting offensive taste or offensive odor by a 4-point evaluation method. Distilled water was used for comparison (evaluated point 1) to evaluate the odor of water. The evaluation was conducted on the following basis:

1.0 to 2.0 or less: No problem.
2.0 to 2.5 or less: Taste and odor are offensive.
2.5 or larger: Taste and odor are very offensive.

5. Overall Evaluation:

Based on the evaluations through the above tests, the overall judgment was rendered to be ◯ when the oxygen-barrier property was not more than 25 $cc/m^2 \cdot day$, the water-barrier property was not more than 7 $g/m^2 \cdot day$, no film was peeled after preserved being filled with water, and the value of evaluating the odor of water was less than 2.0. The overall judgment, on the other hand, was rendered to be X when even any one of the above items was not satisfied.

[Analysis of the Vapor Deposited Film]

1. Analysis of the Hydrocarbon Vapor Deposited Film:

(Preparation of Samples to be Measured)

An organic solvent was introduced into the vapor deposited bottles prepared in Examples and in Comparative Examples, and was vibrated and stirred so that the vapor deposited film was eluted. Chloroform was used as the organic solvent for the bottles A and C (polylactic acid bottle, polyethylene bottle), and hexafluoro-2-propanol was used as the organic solvent for the bottle B (PET bottle).

Next, the organic solvents were recovered from the bottles and were filtered through a filtering paper 5A. The vapor deposited film remained as a residue on the filtering paper. To further wash away the dissolved component of the plastic substrate, the filtered residue was washed and filtered by using an excess of the organic solvent. Thereafter, the residue remaining on the filtering paper was separated and recovered with chloroform. The dispersion of vapor deposited film in the chloroform was dripped onto an aluminum foil together with the chloroform and was dried.

(FT-IR Measurement)

By using a microscopic infrared FT-IR apparatus, a reflection measurement was taken with the Cassegrain scope (measuring frequency range: 600 $cm^{-1}$ to 4000 $cm^{-1}$).

In the measured spectra, a range of 2600 $cm^{-1}$ to 3200 $cm^{-1}$ was used as a region of hydrocarbon absorption peaks.

Next, as the absorption peaks in the asymmetric oscillation mode, the following absorption bands:

$CH_3$ absorption band: 2960 $cm^{-1}$
$CH_2$ absorption band: 2925 $cm^{-1}$
CH absorption band: 2915 $cm^{-1}$ were selected according to the literature of D. S. Patil et al., Journal of Alloys and Compounds, 278 (1998), 130-134. For easy waveform separation, further, an overlapped peak (mixed absorption band of $CH_2$ and $CH_3$): 2860 $cm^{-1}$ was also used for the absorption band in the symmetrical oscillation mode, and was curve-fitted using a curve-fitting software attached to the microscopic infrared FT-IR apparatus.

Peak intensities (peak areas) of 2960 $cm^{-1}$ ($CH_3$), 2925 $cm^{-1}$ ($CH_2$) and 2915 $cm^{-1}$ (CH) in the asymmetric oscillation mode were multiplied by absorbency indexes of the respective peaks (2960 $cm^{-1}$: 0.31, 2925 $cm^{-1}$: 0.29, 2915 $cm^{-1}$: 0.14) to find the respective peak intensity values (reference literature: Polymer Analytical Handbook). By using the corrected peak intensities obtained by being multiplied by absorbency indexes, the total of ($CH_3$): 2960 $cm^{-1}$, ($CH_2$): 2925 $cm^{-1}$ and (CH): 2915 $cm^{-1}$ was set to be 100, and composition ratios of hydrocarbon structures of CH, $CH_2$ and $CH_3$ were found according to the formula described below. FIG. 2 illustrates an example of analysis.

Incidentally, the $CH_2$, $CH_3$ absorption bands in the symmetrical oscillation modes used in the calculation are, usually, such that 2870 $cm^{-1}$ is attributed to $CH_3$ in the symmetrical oscillation mode and 2850 $cm^{-1}$ is attributed to $CH_2$ in the symmetrical oscillation mode. The above two kinds of symmetrical oscillation peaks could not be separated for their waveforms and were treated as a single peak of 2860 $cm^{-1}$. Usually, further, the symmetrically oscillating $CH_2$ absorption peak is observed as a peak relatively smaller than the asymmetric $CH_2$ absorption peak. To more correctly determine the composition ratios of the hydrocarbon structures, the absorption peaks in the asymmetric oscillation modes were regarded to be composition ratios of the hydrocarbon structural units of $CH_3$, $CH_2$ and CH.

$$CH_3(\%) = I(CH_3) \times 100 / \{I(CH_3) + I(CH_2) + I(CH)\}$$

$$I(CH_3) = (CH_3: 2960\ cm^{-1}) \text{curve-fitting value} \times \text{absorbency index} (0.31)$$

$$I(CH_2) = (CH_2: 2925\ cm^{-1}) \text{curve-fitting value} \times \text{absorbency index} (0.29)$$

$$I(CH) = (CH: 2915\ cm^{-1}) \text{curve-fitting value} \times \text{absorbency index} (0.14)$$

Numerals in parentheses are absorbency indexes used for the calculation.

(Measurement of Thickness of Hydrocarbon Vapor Deposited Film)

At the time of forming the vapor deposited film on the test bottles, silicon wafers of 20 mm×20 mm were introduced into the bottles so that the vapor deposited films were separately formed on the silicon wafers depending upon Examples and Comparative Examples.

Next, by using a grading incidence X-ray measuring apparatus (thin-film X-ray analyzer, X'Pert PROMRD, manufactured by PANalytical Co.), the scanning (step: 0.003° was effected with a CuKα ray at an angle of incidence of 0.1° to 2.5° to measure the intensity of reflection of X-rays. A curve of reflection of the measured X-rays was analyzed by using a software WinGixa attached to the X-ray apparatus to find the thickness of the film.

2. Analysis of the Organometal Vapor Deposited Film:

(Distribution of Element Composition and Measurement of Film Thickness)

Wall portions of the vapor deposited bottles having a vapor deposited film formed on the inner surfaces thereof were cut out, and were measured for their composition distributions of silicon, oxygen and carbon in the direction of depth of the vapor deposited film by using an X-ray photoelectron spectroscopic analyzing apparatus (Quantum 2000) manufactured by PHI Co.

As for the film thickness, the sample piece was sputtered under the same conditions as the sputtering rate (1.9 nm/min) found by using the molten quartz ($SiO_2$), and the time required for sputtering the vapor deposited film was regarded to be the film thickness.

TABLE 1

| Condition | Blank 1 PLA | Ex. 1 PLA | Ex. 2 PLA | Ex. 3 PLA | Ex. 4 PLA | Ex. 5 PLA | Ex. 6 PLA | Ex. 7 PLA |
|---|---|---|---|---|---|---|---|---|
| Org. metal vapor deposited layer | | | | | | | | |
| TMVS gas (sccm) | 0 | 50 | 0 | 0 | 50 | 42 | 30 | 25 |
| HMDSO gas (sccm) | 0 | 0 | 50 | 0 | 0 | 0 | 0 | 0 |
| BMS gas (sccm) | 0 | 0 | 0 | 50 | 0 | 0 | 0 | 0 |
| DEMS gas (sccm) | 0 | 0 | 0 | 0 | 0 | 0 | 0 | 0 |
| $O_2$ gas (sccm) | 0 | 0 | 0 | 0 | 0 | 0 | 0 | 0 |
| Acetylene gas (sccm) | 0 | 0 | 0 | 0 | 0 | 8 | 20 | 25 |
| Microwave output (W) | — | 300 | 300 | 300 | 300 | 300 | 300 | 300 |
| Deposition time (sec) | — | 0.5 | 0.5 | 0.5 | 0.5 | 0.5 | 0.5 | 0.5 |
| Film thickness (nm) | — | 14 | 15 | 14 | 14 | 15 | 15 | 15 |
| C/Si/O Ratio | — | 2.5/1/0 | 5/1/0.5 | 2.5/1/0 | 2.5/1/0 | 6/1/0 | 9/1/0 | 13/1/0 |
| Hydrocarbon vapor deposited layer | | | | | | | | |
| Acetylene gas (sccm) | 0 | 30 | 30 | 30 | 0 | 30 | 30 | 30 |
| Acetylene/benzene 1:1 mixed gas (sccm) | 0 | 0 | 0 | 0 | 30 | 0 | 0 | 0 |
| Microwave output (W) | — | 615 | 615 | 615 | 615 | 615 | 615 | 615 |
| Deposition time (sec) | — | 3 | 3 | 3 | 3 | 3 | 3 | 3 |
| Film thickness (nm) | — | 140 | 153 | 140 | 167 | 140 | 140 | 140 |
| Structure $CH_3$ (%) | — | 65.0 | 65.0 | 65.0 | 52.0 | 60.0 | 58.0 | 58.0 |
| Structure $CH_2$ (%) | — | 4.5 | 4.5 | 4.5 | 23.0 | 15.0 | 16.0 | 16.0 |
| Structure CH (%) | — | 30.5 | 30.5 | 30.5 | 25.0 | 25.0 | 26.0 | 26.0 |
| Oxygen barrier ($cc/m^2 \cdot day$) | 55.0 | 5.02 | 5.04 | 5.01 | 6.86 | 5.43 | 5.47 | 5.49 |
| Water barrier ($g/m^2 \cdot day$) | 16.0 | 1.41 | 1.39 | 1.41 | 3.14 | 1.91 | 1.92 | 1.98 |
| Film peeling | — | no | no | no | no | no | no | no |
| Odor of water | 1.6 | 1.2 | 1.2 | 1.2 | 1.2 | 1.2 | 1.2 | 1.2 |
| Overall evaluation | — | ○ | ○ | ○ | ○ | ○ | ○ | ○ |

TMVS: Tetramethylvinylsilane
HMDSO: Hexamethyldimethylsiloxane
BMS: t-butyldimethylsilane
DEMS: Diethoxymethylsilane

TABLE 2

| Condition | Ex. 8 PLA | Ex. 9 PLA | Ex. 10 PLA | Comp. Ex. 1 PLA | Comp. Ex. 2 PLA | Comp. Ex. 3 PLA | Comp. Ex. 4 PLA | Comp. Ex. 5 PLA |
|---|---|---|---|---|---|---|---|---|
| Org. metal vapor deposited layer | | | | | | | | |
| TMVS gas (sccm) | 50 | 50 | 50 | 0 | 20 | 50 | 50 | 0 |
| HMDSO gas (sccm) | 0 | 0 | 0 | 0 | 0 | 0 | 0 | 4.0 |
| BMS gas (sccm) | 0 | 0 | 0 | 0 | 0 | 0 | 0 | 0 |
| DEMS gas (sccm) | 0 | 0 | 0 | 0 | 0 | 0 | 0 | 0 |
| $O_2$ gas (sccm) | 0 | 0 | 0 | 0 | 0 | 0 | 0 | 40.0 |
| Acetylene gas (sccm) | 0 | 0 | 0 | 0 | 30 | 0 | 0 | 0 |
| Microwave output (W) | 300 | 300 | 300 | — | 300 | 300 | 300 | 470 |

TABLE 2-continued

| Condition | Ex. 8 PLA | Ex. 9 PLA | Ex. 10 PLA | Comp. Ex. 1 PLA | Comp. Ex. 2 PLA | Comp. Ex. 3 PLA | Comp. Ex. 4 PLA | Comp. Ex. 5 PLA |
|---|---|---|---|---|---|---|---|---|
| Deposition time (sec) | 0.5 | 0.5 | 0.5 | — | 0.5 | 0.5 | 0.5 | 0.5 |
| Film thickness (nm) | 14 | 14 | 14 | — | 14 | 14 | 14 | 22 |
| C/Si/O Ratio | 2.5/1/0 | 2.5/1/0 | 2.5/1/0 | — | 14/1/0 | 3/1/0 | 3/1/0 | 0/1/1.9 |
| Hydrocarbon vapor deposited layer | | | | | | | | |
| Acetylene gas (sccm) | 30 | 30 | 30 | 30 | 30 | 30 | 30 | 30 |
| Acetylene/benzene 1:1 mixed gas (sccm) | 0 | 0 | 0 | 0 | 0 | 0 | 0 | 0 |
| Microwave output (W) | 615 | 615 | 545 | 615 | 615 | 430 | 340 | 615 |
| Deposition time (sec) | 4 | 1.2 | 3 | 3 | 3 | 3 | 3 | 3 |
| Film thickness (nm) | 180 | 40 | 138 | 140 | 140 | 135 | 135 | 140 |
| Structure $CH_3$ (%) | 67.0 | 50.5 | 44.0 | 66.0 | 64.5 | 33.8 | 33.0 | 65.0 |
| Structure $CH_2$ (%) | 3.2 | 24.5 | 31.0 | 3.5 | 5.5 | 41.8 | 42.5 | 4.5 |
| Structure CH (%) | 29.8 | 25.0 | 25.0 | 31.5 | 30.0 | 24.4 | 24.5 | 30.5 |
| Oxygen barrier ($cc/m^2 \cdot day$) | 3.52 | 6.99 | 7.36 | 4.89 | 5.22 | 29.7 | 32.2 | 8.78 |
| Water barrier ($g/m^2 \cdot day$) | 1.24 | 3.62 | 5.45 | 1.30 | 1.52 | 12.28 | 14.23 | 10.90 |
| Film peeling | no | no | no | peeled | peeled | no | no | peeled |
| Odor of water | 1.2 | 1.2 | 1.2 | 1.6 | 1.3 | 1.2 | 1.2 | 2.7 |
| Overall evaluation | ○ | ○ | ○ | x | x | x | x | x |

TMVS: Tetramethylvinylsilane
HMDSO: Hexamethyldimethylsiloxane
BMS: t-butyldimethylsilane
DEMS: Diethoxymethylsilane The following becomes obvious from Tables 1 and 2.

With the polylactic acid (PLA) bottle A without the vapor deposited film as shown in the Blank 1, the oxygen-barrier property was 55 cc/m²·day and the water-barrier property was 16 g/m²·day, i.e., the barrier property was low against both oxygen and water.

Examples 1 to 3 are when the organometal vapor deposited film 3a was formed on the polylactic acid bottle by using tetramethylvinylsilane (TMVS), hexamethyldisiloxane (HMDSO) and t-butyldimethylsilane (BMS) as the organometal compound gas. The hydrocarbon film was formed by using an acetylene gas as the reaction gas and with a microwave output of 615 W. In Examples 1 to 3, the oxygen-barrier property, water-barrier property, resistance against the peeling of film and odor of water were all favorable.

In Example 4, the film was formed in the same manner as in Example 1 but using a mixed gas of an acetylene gas and a benzene gas at a ratio of 1:1 as the reaction gas for forming the hydrocarbon vapor deposited film 3b. In Example 4, too, the oxygen-barrier property, water-barrier property, resistance against the peeling of film and odor of water were all favorable.

In Examples 5 to 7, the films were formed in the same manner as in Example 1 but using mixed gases of a TMVS gas and an acetylene gas at ratios of 5.25:1 to 1:1 as the reaction gases for forming the organometal vapor deposited film 3a. In these Examples, too, the oxygen-barrier property, water-barrier property, resistance against the peeling of film and odor of water were all favorable.

In Examples 8 and 9, the films were formed in the same manner as in Example 1 but setting the time for forming the hydrocarbon vapor deposited film 3b to be 4 seconds and 1.2 seconds. In these Examples, too, the oxygen-barrier property, water-barrier property, resistance against the peeling of film and odor of water were all favorable.

In Example 10, the film was formed in the same manner as in Example 1 but setting the microwave output to be 545 W for forming the hydrocarbon vapor deposited film 3b. In this Example, too, the oxygen-barrier property, water-barrier property, resistance against the peeling of film and odor of water were all favorable.

Comparative Example 1 is when the organometal vapor deposited film 3a was not formed but the hydrocarbon vapor deposited film 3b only was formed on the bottle A (PLA bottle). Though the oxygen-barrier property and water-barrier property were favorable, the vapor deposited film peeled off in the film peel testing.

In Comparative Example 2, the film was formed in the same manner as in Example 1 but using the TMVS gas and the acetylene gas at a mixing ratio of 2:3 as the reaction gas for forming the organometal vapor deposited film 3a. In this case, the C/Si ratio was 14, and favorable oxygen-barrier property, water-barrier property and odor of water were obtained but the vapor deposited film peeled off in the film peel testing.

In Comparative Examples 3 and 4, the film was formed in the same manner as in Example 1 but setting the microwave outputs to be 430 W and 340 W for forming the hydrocarbon vapor deposited film 3b. In this case, favorable resistance against the peeling of film and odor of water were obtained but water-barrier property was poor.

In Comparative Example 5, the film was formed in the same manner as in Example 1 but using a mixed gas of a hexamethyldisiloxane (O/M element ratio=0.5) and an oxygen gas at a mixing ratio of 1:10 as the reaction gas for forming the organometal vapor deposited film 3a and setting the microwave output to be 470 W. In this case, favorable oxygen-barrier property was obtained but the water-barrier property, resistance against the peeling of film and odor of water were poor. Offensive taste and offensive odor were generated in testing the odor of water.

TABLE 3

| Condition | Comp. Ex. 6 PLA | Blank 2 PET | Ex. 11 PET | Ex. 12 PET | Ex. 13 PET | Comp. Ex. 7 PET | Comp. Ex. 8 PET |
|---|---|---|---|---|---|---|---|
| Org. metal vapor deposited layer | | | | | | | |
| TMVS gas (sccm) | 0 | 0 | 50 | 42 | 25 | 0 | 0 |
| DEMS gas (sccm) | 50 | 0 | 0 | 0 | 0 | 0 | 0 |
| $O_2$ gas (sccm) | 0 | 0 | 0 | 0 | 0 | 0 | 40.0 |
| HMDSO gas (sccm) | 0 | 0 | 0 | 0 | 0 | 0 | 4.0 |
| Acetylene gas (sccm) | 0 | 0 | 0 | 8 | 25 | 0 | 0 |
| Microwave output (W) | 300 | — | 300 | 300 | 300 | — | 470 |
| Deposition time (sec) | 0.5 | — | 0.5 | 0.5 | 0.5 | — | 0.5 |
| Film thickness (nm) | 14 | — | 14 | 15 | 15 | — | 22 |
| C/Si/O Ratio | 5/1/1 | — | 2.5/1/0 | 6/1/0 | 13/1/0 | — | 0/1/1.9 |
| Hydrocarbon vapor deposited layer | | | | | | | |
| Acetylene gas (sccm) | 30 | 0 | 30 | 30 | 30 | 30 | 30 |
| Microwave output (W) | 615 | — | 615 | 615 | 615 | 615 | 615 |
| Deposition time (sec) | 3 | — | 4 | 3 | 3 | 3 | 3 |
| Film thickness (nm) | 140 | — | 180 | 141 | 140 | 140 | 140 |
| Structure $CH_3$ (%) | 65.0 | — | 67.0 | 60.5 | 59.0 | 66.0 | 65.0 |
| Structure $CH_2$ (%) | 4.5 | — | 3.1 | 14.5 | 15.5 | 3.5 | 4.5 |
| Structure CH (%) | 30.5 | — | 29.9 | 25.0 | 25.5 | 31.5 | 30.5 |
| Oxygen barrier (cc/$m^2$ · day) | 5.22 | 5 | 0.34 | 0.72 | 0.84 | 0.50 | 0.50 |
| Water barrier (g/$m^2$ · day) | 1.98 | 2 | 0.17 | 0.34 | 0.35 | 0.23 | 0.23 |
| Film peeling | no | — | no | no | no | peeled | peeled |
| Odor of water | 2.1 | 1.6 | 1.1 | 1.1 | 1.2 | 1.2 | 2.0 |
| Overall evaluation | x | — | ○ | ○ | ○ | x | x |

TMVS: Tetramethylvinylsilane
HMDSO: Hexamethyldimethylsiloxane
DEMS: Diethoxymethylsilane The following becomes obvious from Table 3.

In Comparative Example 6, the film was formed in the same manner as in Example 1 but using the diethoxymethylsilane (O/M element ratio=2.0) as the reaction gas for forming the organometal vapor deposited film 3a. In this case, favorable oxygen-barrier property, water-barrier property and resistance against the peeling of film were obtained but the odor of water was offensive. Offensive taste and offensive odor were generated in testing the odor of water.

Referring to the blank 2, the oxygen-barrier property and water-barrier property of the bottle B (PET bottle) without the vapor deposited film were those of the polyethylene terephthalate resin (the polyethylene terephthalate bottle has a barrier property higher than that of the polylactic acid bottle A, but a more higher barrier property is often required in the market).

In Example 11, the film was formed by using the TMVS gas as the reaction gas for forming the organometal vapor deposited film 3a on the bottle B (PET bottle) and by using the acetylene gas for forming the hydrocarbon vapor deposited film 3b while setting the microwave output to be 615 W (vapor deposition time of 4 seconds). The oxygen-barrier property, water-barrier property, resistance against the peeling of film and odor of water were all favorable.

In Examples 12 and 13, the film was formed in the same manner as in Example 11 but using mixed gases of TMVS and acetylene at mixing ratios of 5.25:1 and 1:1 as the reaction gases for forming the organometal vapor deposited film 3a on the bottle B and by setting the time for depositing the hydrocarbon vapor deposition layer 3b to be 3 seconds. The oxygen-barrier property, water-barrier property, resistance against the peeling of film and odor of water were all favorable in both of Examples 12 and 13.

In Comparative Example 7, the organometal vapor deposited film 3a was not formed but the hydrocarbon vapor deposited film 3b only was formed on the bottle B. The oxygen-barrier property, water-barrier property and odor of water were favorable but the resistance against the peeling of film was poor.

In Comparative Example 8, the film was formed in the same manner as in Example 11 but using a mixed gas of the hexamethyldisiloxane (O/M element ratio=0.5) and the oxygen gas at a mixing ratio of 1:10 as the organometal compound gas for depositing the organometal vapor deposited film 3a on the bottle B, setting the microwave output to be 470 W, and setting the time for depositing the hydrocarbon vapor deposited layer 3b to be 3 seconds. In this case, the oxygen-barrier property and water-barrier property were favorable but the resistance against the peeling of film and odor of water were poor. Offensive taste and offensive odor were generated in testing the odor of water.

TABLE 4

| Condition | Blank 3 HDPE | Ex. 14 HDPE | Ex. 15 HDPE | Ex. 16 HDPE | Comp. Ex. 9 HDPE | Comp. Ex. 10 HDPE |
|---|---|---|---|---|---|---|
| Org. metal vapor deposited layer | | | | | | |
| TMVS gas (sccm) | 0 | 50 | 42 | 25 | 0 | 0 |
| DEMS gas (sccm) | 0 | 0 | 0 | 0 | 0 | 0 |
| $O_2$ gas (sccm) | 0 | 0 | 0 | 0 | 0 | 40.0 |
| HMDSO gas (sccm) | 0 | 0 | 0 | 0 | 0 | 4.0 |
| Acetylene gas (sccm) | 0 | 0 | 8 | 25 | 0 | 0 |
| Microwave output (W) | — | 300 | 300 | 300 | — | 470 |
| Deposition time (sec) | — | 0.5 | 0.5 | 0.5 | — | 0.5 |
| Film thickness (nm) | — | 14 | 15 | 15 | — | 22 |
| C/Si/O Ratio | — | 2.5/1/0 | 6/1/0 | 13/1/0 | — | 0/1/1.9 |

| Condition | Blank 3 PET | Ex. 14 PET | Ex. 15 PET | Ex. 16 PET | Comp. Ex. 9 PET | Comp. Ex. 10 PET |
|---|---|---|---|---|---|---|
| Hydrocarbon vapor deposited layer | | | | | | |
| Acetylene gas (sccm) | 0 | 30 | 30 | 30 | 30 | 30 |
| Microwave output (W) | — | 615 | 615 | 615 | 615 | 615 |
| Deposition time (sec) | — | 4 | 3 | 3 | 3 | 3 |
| Film thickness (nm) | — | 180 | 140 | 140 | 140 | 140 |
| Structure $CH_3$ (%) | — | 66.5 | 60.0 | 58.0 | 66.0 | 65.0 |
| Structure $CH_2$ (%) | — | 3.7 | 15.0 | 16.0 | 3.7 | 4.5 |
| Structure CH (%) | — | 29.8 | 25.0 | 26.0 | 31.3 | 30.5 |
| Oxygen barrier (cc/m$^2$ · day) | 218 | 18 | 23 | 25 | 19 | 19 |
| Water barrier (g/m$^2$ · day) | 1.0 | 0.08 | 0.10 | 0.11 | 0.09 | 0.09 |
| Film peeling | — | no | no | no | peeled | peeled |
| Odor of water | 1.9 | 1.8 | 1.8 | 1.8 | 1.8 | 2.8 |
| Overall evaluation | — | ○ | ○ | ○ | x | x |

TMVS: Tetramethylvinylsilane
HMDSO: Hexamethyldimethylsiloxane
DEMS: Diethoxymethylsilane The following becomes obvious from Table 4.

Referring to the blank 3, the oxygen-barrier property and water-barrier property of the bottle C(HDPE bottle) without the vapor deposited film were those of the polyethylene resin. Though the water-barrier property was higher than that of the bottle A (PLA bottle), the oxygen-barrier property was of a very low value.

Example 14 is when a film was formed by using the TMVS gas as the organometal compound gas for forming the organometal vapor deposited film 3a on the bottle C, using the acetylene gas for forming the hydrocarbon vapor deposited film 3b, and setting the microwave output to be 615 W. The oxygen-barrier property, water-barrier property, resistance against the peeling of film and odor of water were all favorable.

In Examples 15 and 16, the film was formed in the same manner as in Example 14 but using mixed gases of TMVS and acetylene at mixing ratios of 5.25:1 and 1:1 as the reaction gases for forming the organometal vapor deposited film 3a on the bottle C, and setting the time for depositing the hydrocarbon vapor deposition layer 3b to be 3 seconds. In these cases, the oxygen-barrier property, water-barrier property, resistance against the peeling of film and odor of water were all favorable.

In Comparative Example 9, the organometal vapor deposited film 3a was not formed but the hydrocarbon vapor deposited film only was formed on the bottle C. The oxygen-barrier property, water-barrier property and odor of water were favorable but the resistance against the peeling of film poor.

In Comparative Example 10, the film was formed in the same manner as in Example 14 but using a mixed gas of hexamethyldisiloxane (O/M element ratio=0.5) and oxygen gas at a mixing ratio of 1:10 as the reaction gas for forming the organometal vapor deposited film 3a on the bottle C, setting the microwave output to be 470 W, and setting the time for depositing the hydrocarbon vapor deposition layer 3b to be 3 seconds. In this case, the oxygen-barrier property and water-barrier property were favorable but the resistance against the peeling of film and odor of water were poor. Odor of water was evaluated to be very bad (generating offensive taste and offensive odor).

The invention claimed is:

1. A plastic formed article comprising a plastic substrate and a vapor deposited film formed on a surface of said plastic substrate by a plasma CVD method, wherein:
said vapor deposited film includes an organometal vapor deposited layer formed on a side of said plastic substrate and having an element ratio C/M (M is a metal element) of 2.5 to 13 and an element ratio O/M of not larger than 0.5, and a hydrocarbon vapor deposited layer formed on said organometal vapor deposited layer; and said hydrocarbon vapor deposited layer has a thickness in a range of 40 to 180 nm, exhibits peaks stemming from CH, $CH_2$ and $CH_3$ over a region of wave numbers of 3200 to 2600 $cm^{-1}$ as measured by FT-IR, and has a $CH_2$ ratio of not larger than 35% and a $CH_3$ ratio of not less than 40% per the total of CH, $CH_2$ and $CH_3$ calculated from the above peaks.

2. The plastic formed article according to claim 1, wherein said element M is Si.

3. The plastic formed article according to claim 1, wherein said organometal vapor deposited layer has a thickness in a range of 3 to 40 nm.

4. The plastic formed article according to claim 1, wherein said plastic substrate is formed by using a biodegradable plastic material.

5. The plastic formed article according to claim 4, wherein said biodegradable plastic material is a polylactic acid.

6. The plastic formed article according to claim 1, wherein said plastic substrate is a bottle, and said vapor deposited film is formed on at least an inner surface of said bottle.

7. A method of producing a plastic formed article of claim 1 having a vapor deposited film on the surface thereof, comprising steps of:

forming an organometal vapor deposited layer having an element ratio C/M (M is a metal element) of 2.5 to 13 and an element ratio O/M of not larger than 0.5 by a plasma CVD without using oxygen but feeding an organometal compound gas as a reaction gas onto a plastic substrate; and forming a hydrocarbon vapor deposited layer on said organometal vapor deposited layer by a plasma CVD with using microwaves or a high frequency of an output of not less than 450 W while feeding an aliphatic unsaturated hydrocarbon gas and/or an aromatic hydrocarbon gas as a reaction gas.

8. The method of production according to claim 7, wherein the time for forming said hydrocarbon vapor deposited layer is 0.5 to 5 seconds.

9. The method of production according to claim 7, wherein ethylene and/or acetylene are used as the reaction gas in the step of forming said hydrocarbon vapor deposited layer.

10. The method of production according to claim 7, wherein a compound without containing oxygen atom is used as the organometal compound in the step of forming said organometal vapor deposited layer.

11. The method of production according to claim 7, wherein an organosilicon compound is used as said organometal compound.

12. The method of production according to claim 11, wherein a trimethylvinylsilane is used as said organosilicon compound.

13. The method of production according to claim 11, wherein t-butyldimethylsilane is used as said organosilicon compound.

14. The method of production according to claim 7, wherein a gas of the organometal compound alone is used as the reaction gas in the step of forming said organometal vapor deposited layer.

15. The method of production according to claim 7, wherein a mixed gas of a gas of the organometal compound and a gas of an aliphatic unsaturated hydrocarbon or aromatic hydrocarbon is used as the reaction gas in the step of forming said organometal vapor deposited layer.

16. The method of production according to claim 15, wherein said reaction gas contains said organometal compound gas in amount of not less than 50 mol %.

17. The method of production according to claim 15, wherein ethylene and/or acetylene are used as said aliphatic unsaturated hydrocarbons.

18. The method of production according to claim 7, wherein said plastic substrate is made from a biodegradable plastic material.

19. The method of production according to claim 18, wherein said biodegradable plastic material is a polyhydroxyalkanoate.

20. The method of production according to claim 18, wherein said biodegradable plastic material is a polylactic acid.

21. The method of production according to claim 7, wherein a bottle is used as said plastic substrate and the vapor deposited film is formed at least an inner surface of the bottle.

* * * * *